United States Patent
Anderson et al.

(10) Patent No.: US 6,932,621 B2
(45) Date of Patent: Aug. 23, 2005

(54) CONNECTOR INTERFACE PAD FOR STRUCTURALLY INTEGRATED WIRING

(75) Inventors: David M. Anderson, Issaquah, WA (US); David R. Gladish, Bellevue, WA (US); Robert T. Johnson, Everett, WA (US); Matthew C. Malkin, Seattle, WA (US); Simon D. Senibi, Kent, WA (US); Terrance L. Thomas, Covington, WA (US)

(73) Assignee: The Boeing Company, Chicago, IL (US)

( * ) Notice: Subject to any disclaimer, the term of this patent is extended or adjusted under 35 U.S.C. 154(b) by 256 days.

(21) Appl. No.: 10/394,784

(22) Filed: Mar. 21, 2003

(65) Prior Publication Data

US 2004/0185688 A1 Sep. 23, 2004

(51) Int. Cl.[7] .............................................. H01R 12/00
(52) U.S. Cl. ........................ 439/70; 439/34; 439/329; 439/495; 439/74
(58) Field of Search ........................... 439/34, 70, 329, 439/495, 74

(56) References Cited

U.S. PATENT DOCUMENTS

| 4,526,432 | A | * | 7/1985 | Cronin et al. | ................ 439/320 |
| 5,743,747 | A | * | 4/1998 | Sobhani | ........................ 439/67 |
| 6,390,841 | B1 | * | 5/2002 | Zaguskin | ..................... 439/248 |

* cited by examiner

Primary Examiner—Truc Nguyen
(74) Attorney, Agent, or Firm—Harness, Dickey & Pierce P.L.C.

(57) ABSTRACT

A connector pad is provided having a base, a top opposite the base, and tapered sidewalls therebetween. The tapering minimizes stress concentrations when the connector pad is bonded into, or on the surface of a structure. The connector pad consists of a plurality of structural load carrying plies suitable for sandwiching a flat structurally integrated wiring array therebetween. A plurality of plated through holes formed in the connector pad enable access to the wiring array therein.

20 Claims, 2 Drawing Sheets

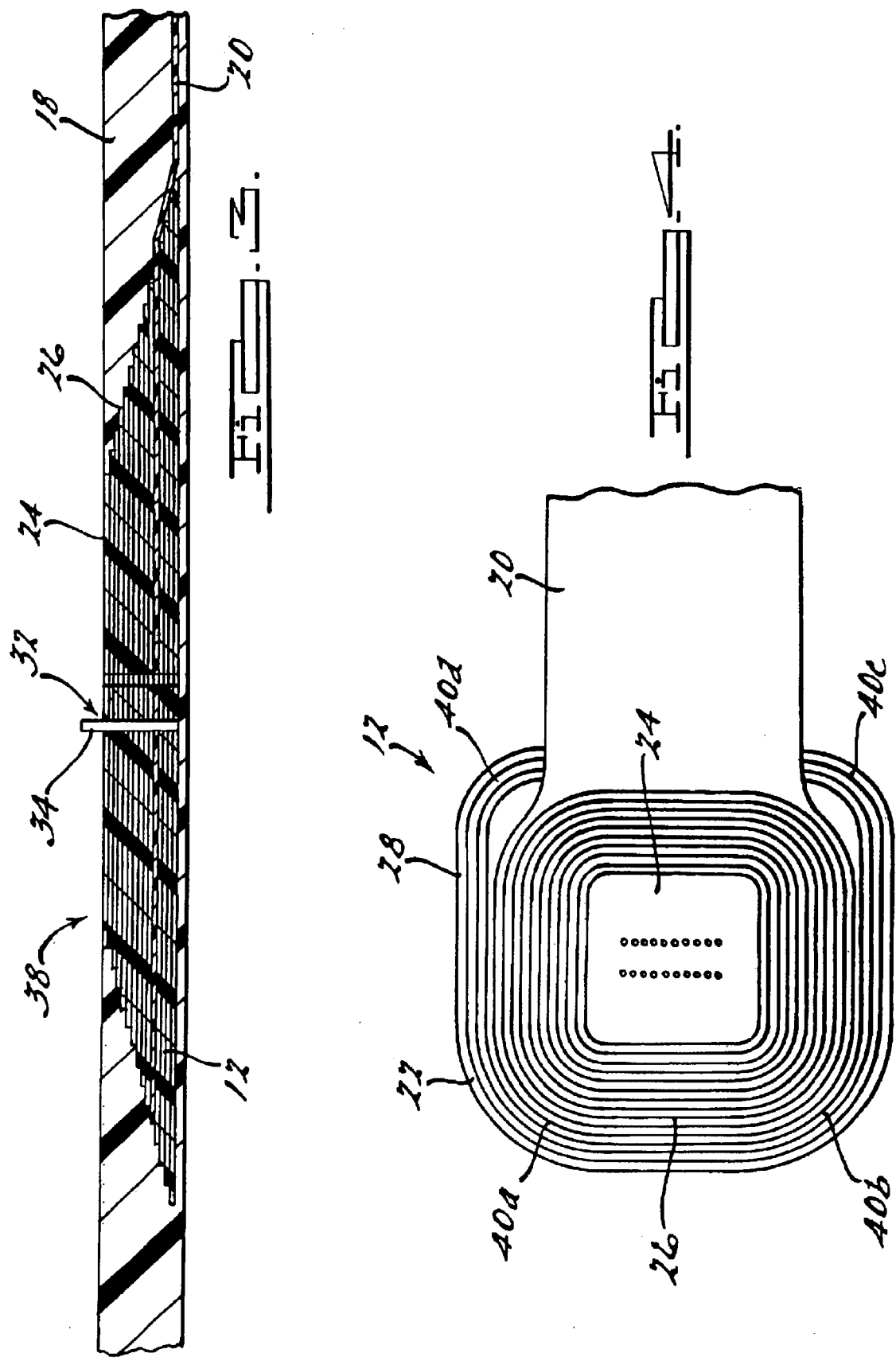

CONNECTOR INTERFACE PAD FOR STRUCTURALLY INTEGRATED WIRING

FIELD OF THE INVENTION

The present invention relates to electrical connector pads for interfacing wirings and more particularly, to an electrical connector pad for interfacing structurally integrated wiring with non-structurally integrated wiring.

BACKGROUND OF THE INVENTION

Modern vehicles such as aircraft and space vehicles employ a multitude of sensors and actuators to monitor and react to-various aspects of vehicle performance and integrity. These "multifunctional structures", "smart structures", or "health management" devices are often hard-wired to a main controller or other device. Such hard wiring is labor intensive, subject to human error, undesirably increases the weight and complexity of the vehicle, and prone to durability concerns.

To avoid these drawbacks, structurally integrated wiring has recently been developed. These wirings are bonded onto or within the structural components of the vehicle. This minimizes the number of attachment parts and installation steps needed. These wirings also increase the potential for automated processing which reduces the potential for human error.

One area related to structurally integrated wirings that needs further development is an interface connector pad between the structurally integrated wiring and non-structurally integrated wiring. Most "multifunctional structures", "smart structures", or health management devices and structurally integrated wirings are in a flat form. As such, it would be desirable to provide an interface connector pad that accommodates the flat configuration of the structurally integrated wiring. It would also be desirable to provide an interface connector pad that is integrated into the structural components of the vehicle so as to increase durability over other traditional connection solutions.

SUMMARY OF THE INVENTION

The above and other objects are provided by a connector pad having a base, a top opposite the base, and tapered sidewalls therebetween. The tapering of the connector pad minimizes stress concentrations when the connector pad is bonded into, or on the surface of a structure. The connector pad preferably consists of a plurality of structural load carrying plies (such as glass-reinforced polyimide layers) suitable for sandwiching a flat or flex circuit type structurally integrated wiring array therebetween. A plurality of plated through holes formed in the connector pad enable access to the wiring array therein. The through holes are shaped to compliment and retain a plurality of compliant pins therein.

Further areas of applicability of the present invention will become apparent from the detailed description provided hereinafter. It should be understood that the detailed description and specific examples are intended for purposes of illustration only and are not intended to limited the scope of the invention.

BRIEF DESCRIPTION OF THE DRAWINGS

The present invention will become more fully understood from the detailed description and the accompanying drawings, wherein:

FIG. 3 is a cross-sectional view of the connector pad of the present invention embedded within a structure.

FIG. 4 is a top view of the connector pad of the present invention.

DETAILED DESCRIPTION OF THE PREFERRED EMBODIMENTS

The following description of the preferred embodiment is merely exemplary in nature and is in no way intended to limit the invention, its application, or uses.

Figure 1:
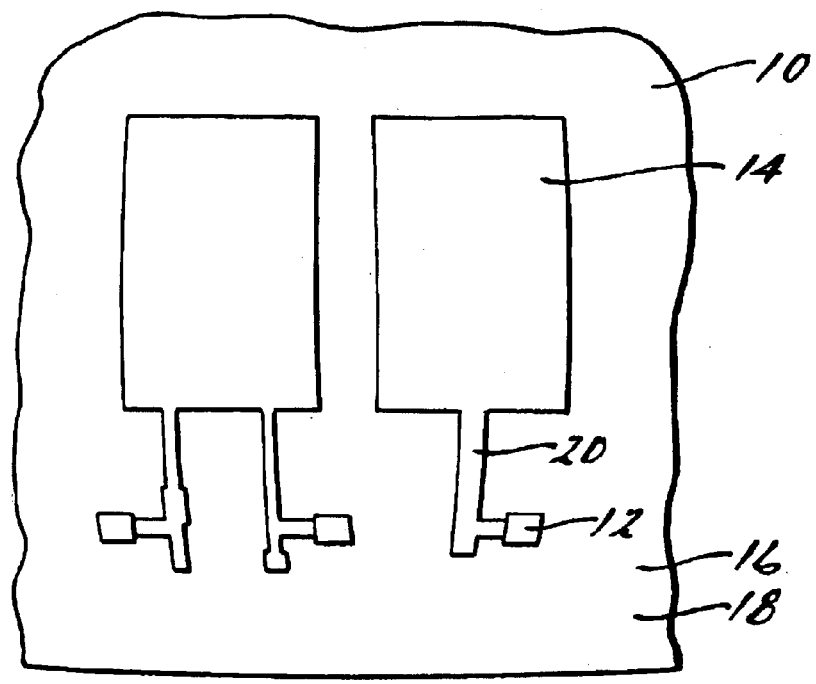
FIG. 1 is a side view of a vehicle having a connector pad incorporating the teachings of the present invention incorporated therein.

FIG. 1 illustrates a vehicle 10 in the form of an aircraft having a connector pad 12 of the present invention mounted thereto. More particularly, an integrated actuator or sensor 14, such as a piezo actuator or acoustic piezo sensor is mounted to a surface 16 of a fuselage 18 of the vehicle 10 by bonding with an adhesive of the like. Although the sensor 14 is illustrated as being mounted to an outer surface of the fuselage 18, the sensor 14 could also be embedded therein. Embedding may be preferred if the fuselage is a composite laminated structure. On the other hand, surface mounting is likely preferred on metal or non-laminated structures. Surface mounting may also be possible for mounting on a composite structure.

A flat or flex circuit type wiring array 20 extends from the sensor 14 along the fuselage 18. The wiring array 20 is structurally integrated with the fuselage 18 by being bonded thereto by an adhesive or the like. Although the wiring array 20 is illustrated as being mounted to an outer surface of the fuselage 18, the wiring array 20 could also be embedded therein. Embedding may be preferred if the fuselage is a composite laminated structure. On the other hand, surface mounting is likely preferred on metal or non-laminated structures. Surface mounting may also be possible for mounting on a composite structure.

The connector pad 12 is coupled to the wiring array 20. The connector pad 12 is structurally integrated with the fuselage 18 by being bonded thereto by an adhesive or the like. Although the connector pad 12 is illustrated as being mounted to an outer surface of the fuselage 18, the connector pad 12 could also be embedded therein. Embedding may be preferred if the fuselage is a composite laminated structure. On the other hand, surface mounting is preferred on metal or non-laminated structures. Surface mounting may also be possible for mounting on a composite structure.

Figure 2:
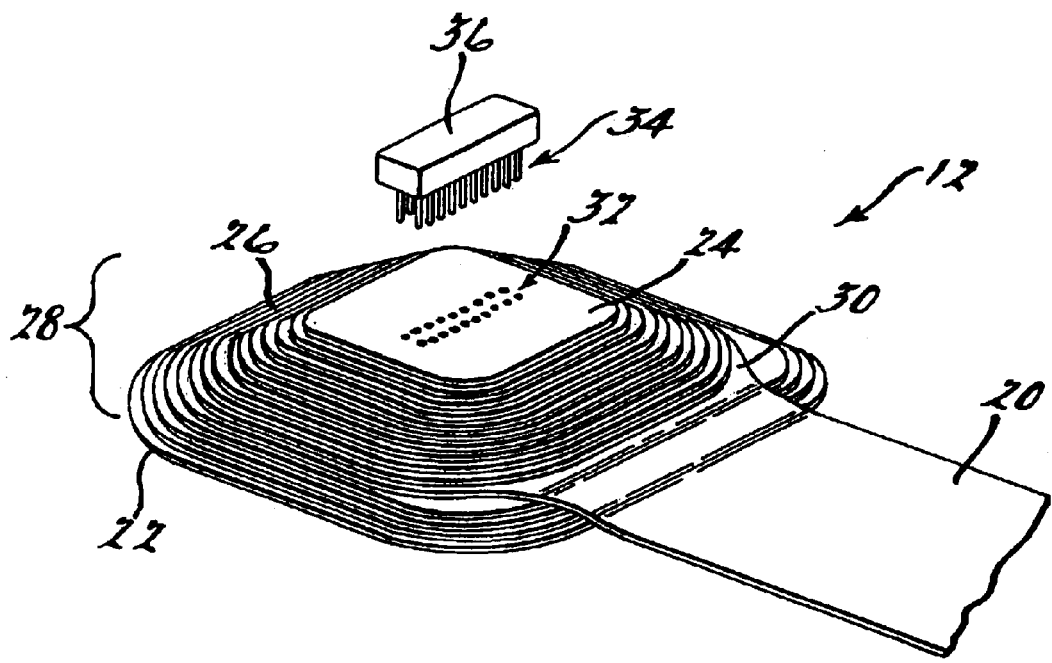
FIG. 2 is a perspective view of the connector pad of the present invention.

Turning now to FIG. 2, the connector pad 12 of the present invention is illustrated in greater detail. The connector pad 12 includes a generally square shaped base 22, a generally square shaped top 24 opposite the base 22, and tapered sidewalls 26 extending therebetween. The tapered shape of the connector pad 12 minimizes stress concentrations when the connector is bonded into, or on the surface of a structure such as the fuselage 18 in FIG. 1.

The connector pad 12 preferably includes a plurality of laminated members 28 in the form of structural load carrying plies. Presently, glass-reinforced polyimide layers are preferred for the members 28 although one skilled in the art will appreciate that other materials could substitute therefore. For example, lower temperature resin systems could be used if low cure temperature composites were used when embedding the pad, or a low-temperature process of secondarily bonding the pad to the structural surface is used. Other materials can also be used to accommodate load carrying capability and stiffness of the pad. Additional double plies (not illustrated) may also be used above and/or below the connector pad 12 to provided enhanced load carrying capacity. This may be required if cut-outs in the structural skin are present to accommodate access to an embedded connector pad.

An end 30 of the wiring array 20 is sandwiched between the members 28. The width of the wiring array 20 is accounted for when configuring the connector pad 12 so that the wiring array 20 compliments the tapering of the tapered sidewalls 26. The wiring array 20 is preferably of the flat or flex circuit type that is easily embeddable or permits bonding to a structural surface.

A plurality of through holes 32 are formed in an array from the top 24 of the connector pad 12. The array preferably consists of two or more parallel rows of equidistantly spaced apart through holes 32 essentially centrally disposed relative to the connector pad 12 or at least the top 24. The through holes 32 provide access to the wiring array 20 sandwiched within the connector pad 12. The through holes 32 are generally plated with copper and tinned with solder to provide connectivity to the signal wiring, power wiring, or ground layers located in the pad. For added durability, other materials may also be used. The through holes 32 are sized to receive compliment pins and support multiple insertion and removals of an array of pins 34 extending from a connector 36 therein. The pins 34 are preferably compliant pins with connector contacts at the opposite end. The connector contact (located opposite the compliant pin feature) will either be a socket contact or a pin contact. Thus, the compliant pin is inserted into the pad and remains, most all mating and de-mating occurs with the contact socket or pin at the opposite end. This allows the compliant pin 34 to remain inserted in the holes 32, and only be removed when absolutely necessary. Limiting compliant pin insertion and removal in the through holes is desirable to prevent damage to the holes. Alternatively, if only a very limited number of mating and de-mating connections are required to be made with the pad, a connector can be interfaced directly to the pad.

As illustrated in FIG. 3, the through holes 32 enable the compliant pins 34 to pass from the top 24 of the connector pad 12 through the wiring array 20 to establish electrical connection therebetween. In this way, the connector pad 12 provides an interface for interconnecting the structurally integrated wiring array 20 with non-structurally integrated wiring (not shown) via the compliant pins 34 and connector 36 (FIG. 2).

FIG. 3 also illustrates a configuration of the present invention wherein the connector pad 12 is embedded within the fuselage 18, or other composite structure. An opening 38 in the fuselage 18 provides access to the through holes 32 so that the compliant pins 34 may be inserted therein. As can be seen, the tapered sidewalls 26 mate with inversely tapering edges of the fuselage 18.

Turning now to FIG. 4, a top view of the connector pad 12 is illustrated. As illustrated, the dimensions of the members 28 and tapered sidewalls 26 of the connector pad 12 are exaggerated, The stepping of adjacent members 28 is also exaggerated. This is to ease the understanding of the invention. A small or shallow taper allows gradual transition of loads and minimizes stress and strain concentrations. In practice, the connector pad 12 is on the order of about 0.070 inches thick and the members 28 are on the order of about 0.004 to about 0.005 inches thick.

The connector pad 12 illustrated includes about fifteen (15) members 28 laminated on top of each other. Each member 28 is coaxially aligned with an adjacent member 28 but progressively decreases in circumference from the base 22 to the top 24. The variation in dimension from one member 28 to the next provides the tapering of the connector pad 12 and more particularly, the individual edges of the members 28 stack up to form the tapered sidewalls 26.

The particular number of members 28 forming the connector pad 12 is selected to provide the desired rigidity to the connector pad 12 while controlling the overall thickness of the connector pad 12 between the base 22 and the top 24. The individual members 28 are preferably bonded to one another by an adhesive or the like. Alternatively, the pad can be formed from one solid laminate and the taper can be cut into the pad.

The tapered sidewalls 26 extend between the top 24 and base 22 at an angle preferably equal to or less than about 2.8 to 3 degrees. Although other shapes such as hemi-ellipsoidal and truncated conical may be employed, the connector pad 12 is preferably pyramidal in shape; such as a truncated, right-rectangular pyramid, with rounded corners 40 between adjacent sidewalls 26. The radius of curvature of each of the corners 40 may be equal but preferably the radii of curvature of the corners 40a and 40b opposite the wiring array 20 are equal to one another but different from the radii of curvature of the corners 40c and 40d adjacent the wiring array 20, which are preferably equal to one another. This provides a linear tapered ramp wide enough to support integrated wire 20. It is preferable that the integrated wire 20 does lay a complex contour—such as linear edge taper and a corner taper. Alternatively if the integrated wire 20 were narrower, it is possible to reduce the radius of corners 40c and 40d.

If desired, the connector pad 12 can provide impedance control and shielding for the wiring array 20. This is preferably accomplished by making the integrated wire in a multi-layer stripline form and combining with the pad in a similar manner—maintaining the taper.

Thus, a connector pad is provided having a base, a top opposite the base, and tapered sidewalls therebetween. The tapering minimizes stress concentrations when the connector pad is bonded into, or on the surface of a structure. The connector pad preferably consists of a plurality of structural load carrying plies (such as glass-reinforced polyimide layers) suitable for sandwiching a flat or flex circuit type structurally integrated wiring array therebetween. A plurality of plated through holes formed in the connector pad enable access to the wiring array therein. The through holes are shaped to compliment and retain a plurality of compliant pins therein.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A connector pad comprising:
   a base;
   a top layer opposite said base;
   sidewalls extending between said base and said top layer;
   a plurality of through holes formed in said pad from said top layer; and
   wherein a wiring array is provided within said pad between said base and said top.

2. The connector pad of claim 1, wherein said wiring array extends to said through holes.

3. The connector pad of claim 2 wherein said wiring array further comprises a flex circuit wiring array.

4. The connector pad of claim 2 wherein said wiring array is integrated with a structure to which said pad is bonded.

5. The connector pad of claim 1 further comprising a plurality of layers disposed between said base and said top layer.

6. The connector pad of claim 5 wherein a wiring array is disposed between two of said layers, said wiring array extending to said through holes.

7. The connector pad of claim 1 wherein said sidewalls extend at an angle equal to or less than about 3.0 degrees relative to said base.

8. A connector pad comprising:
- a plurality of coaxially stacked layers extending from a base to a top layer, said plurality of stacked layers progressively decreasing in circumference from said base toward said top layer;
- ends of said plurality of stacked layers forming generally tapered sidewalls extending between said base and said top layer;
- a wiring array disposed between two of said layers; and
- a plurality of through holes formed through said layers, said wiring array extending to said through holes.

9. The connector pad of claim 8 wherein said wiring array further comprises a flex circuit wiring array.

10. The connector pad of claim 8 wherein said wiring array is integrated with a structure to which said pad is bonded.

11. The connector pad of claim 8 wherein said pad is one of bonded to a surface of said structure and embedded within said structure.

12. The connector pad of claim 8 wherein said tapered sidewalls extend at an angle equal to or less than about 3.0 degrees relative to said base.

13. The connector pad of claim 8 wherein said pad includes rounded corners between said sidewalls.

14. The connector pad of claim 13 wherein at least two of said corners have radii of curvature equal to a first value.

15. The connector pad of claim 14 wherein at least two other of said corners have radii of curvature equal to a second value which is different from said first value.

16. A connector pad and vehicle assembly comprising:
- a structural member;
- a electronic device integrated with said structural member;
- a wiring array extending from said electronic device and integrated with said structural member; and
- a connector pad coupled to said wiring array and integrated with said structural member, said connector pad including:
  - a plurality of stacked layers extending from a base to a top layer;
  - ends of said plurality of stacked layers forming generally tapered sidewalls extending between said base and said top layer; and
  - a plurality of through holes formed through said layers, said wiring array extending to said through holes.

17. The assembly of claim 16 wherein said pad of said connector pad is bonded to a surface of said structural member.

18. The assembly of claim 16 wherein said pad of said connector pad is embedded within said structural member.

19. The assembly of claim 16 wherein said tapered sidewalls of said connector pad extend at an angle equal to or less than about 3.0 degrees relative to said base.

20. The assembly of claim 16 wherein said plurality of layers of said connector pad further comprise polyimide.

* * * * *